(12) United States Patent
Shimizu

(10) Patent No.: US 7,697,633 B2
(45) Date of Patent: Apr. 13, 2010

(54) RECEIVING METHOD AND RECEIVING APPARATUS

(75) Inventor: Takanori Shimizu, Tokyo (JP)

(73) Assignee: Sony Computer Entertainment Inc., Tokyo (JP)

( * ) Notice: Subject to any disclaimer, the term of this patent is extended or adjusted under 35 U.S.C. 154(b) by 1037 days.

(21) Appl. No.: 11/348,540

(22) Filed: Feb. 6, 2006

(65) Prior Publication Data

US 2006/0256782 A1 Nov. 16, 2006

(30) Foreign Application Priority Data

May 13, 2005 (JP) .............................. 2005-141352

(51) Int. Cl.
*H04L 27/00* (2006.01)
*G06K 9/60* (2006.01)
(52) U.S. Cl. ...................................... 375/316; 382/304
(58) Field of Classification Search ................. 375/260, 375/267, 316, 346–350; 382/302, 304–305
See application file for complete search history.

(56) References Cited

U.S. PATENT DOCUMENTS

| | | | | |
|---|---|---|---|---|
| 5,243,629 | A * | 9/1993 | Wei | 375/299 |
| 6,166,735 | A * | 12/2000 | Dom et al. | 715/749 |
| 6,181,749 | B1 * | 1/2001 | Urabe et al. | 375/267 |
| 6,912,327 | B1 * | 6/2005 | Hori et al. | 382/305 |
| 7,286,609 | B2 * | 10/2007 | Maltsev et al. | 375/267 |
| 7,372,907 | B2 * | 5/2008 | Munoz et al. | 375/260 |
| 7,414,746 | B2 * | 8/2008 | Tanaka et al. | 358/1.15 |

FOREIGN PATENT DOCUMENTS

| | | |
|---|---|---|
| JP | 11-155139 | 6/1999 |
| JP | 2001-28575 | 1/2001 |
| JP | 2001-326863 | 11/2001 |
| JP | 2005-151120 | 6/2005 |
| JP | 2005-269506 | 9/2005 |
| WO | 2004/100433 | 11/2004 |

OTHER PUBLICATIONS

Notification of Reason(s) for Refusal dated Nov. 5, 2008, from the corresponding Japanese Application.
Notification of Reason(s) for Refusal dated Aug. 4, 2009, from the corresponding Japanese Application.

* cited by examiner

*Primary Examiner*—Khanh C Tran
(74) *Attorney, Agent, or Firm*—Katten Muchin Rosenman LLP

(57) ABSTRACT

An RF unit receives radio-frequency signals where a plurality of channels are frequency-multiplexed. An A-D unit converts the radio-frequency signals to digital signals. A processing unit processes the plurality of channels contained in the digital signals which have been converted by the A-D unit. The processing unit includes: a band-pass filter, having bands corresponding respectively to the plurality of frequency-multiplexed channels, which separates the digital signals into the plurality of channels; and a demodulation unit which demodulates the plurality of channels separated by the band-pass filter.

5 Claims, 9 Drawing Sheets

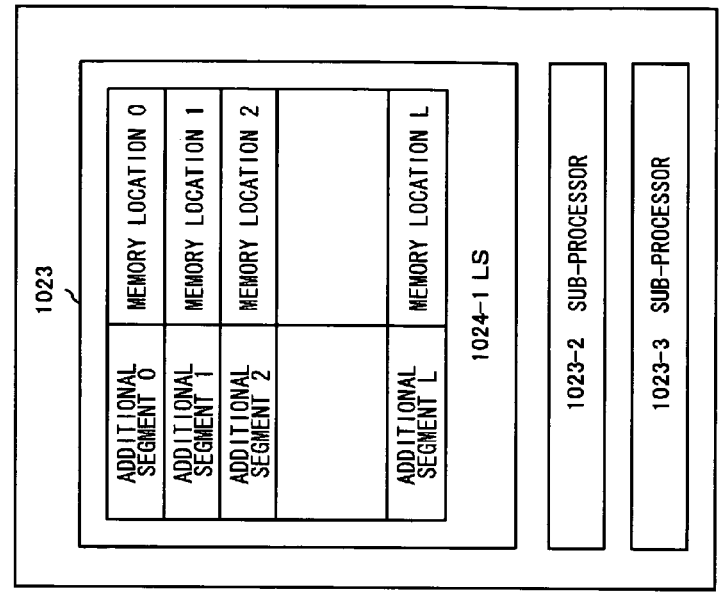
FIG.4B
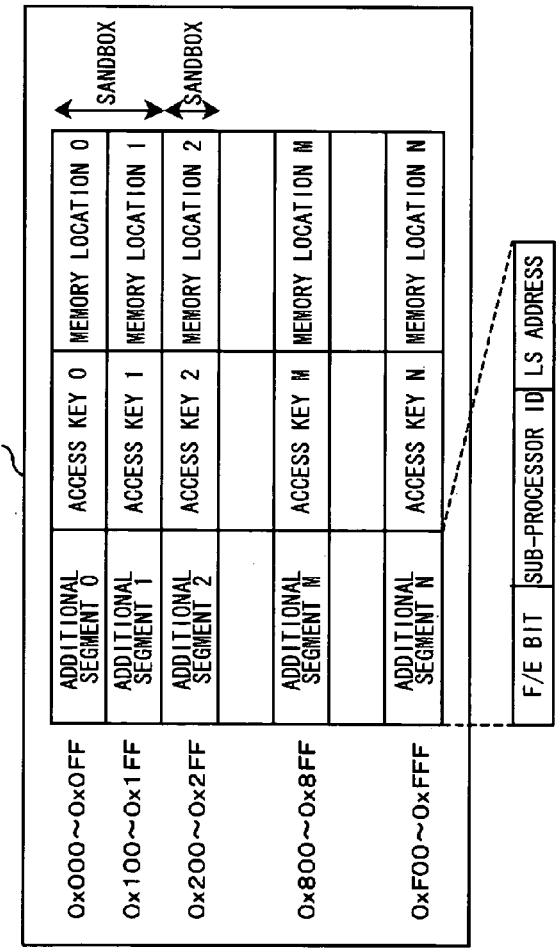
FIG.4A
FIG.4C
KEY CONTROL TABLE

20

20

RECEIVING METHOD AND RECEIVING APPARATUS

BACKGROUND OF THE INVENTION

1. Field of the Invention

The present invention relates to the receiving technologies, and it particularly relates to method and apparatus for receiving frequency-multiplexed signals.

2. Description of the Related Art

A plurality of channels in digital television broadcasting or NTSC (National Television Standards Committee) type television broadcasting are frequency-multiplexed. And broadcast waves on a plurality of frequency-multiplexed channels are received by a receiving apparatus. To the broadcast waves, the receiving apparatus carries out a conversion of the radio frequencies to intermediate frequencies and a conversion of the intermediate frequencies to baseband frequencies and at the same time extracts a predetermined channel by the use of a band-pass filter. In addition, the receiving apparatus reproduces a program on the extracted predetermined channel (See Reference (1) in the following Related Art List, for instance).

2. Related Art List (1) Japanese Patent Application Laid-Open No. 2001-326863

Under these circumstances, the inventor of the present invention has come to recognize a problem as described below. When a receiving apparatus performs a conversion of radio frequencies of received broadcast waves to intermediate frequencies, it extracts a predetermined channel by a band-pass filter. To demodulate a single channel, there is a need for one converter to perform a conversion processing as described above. Accordingly, a plurality of converters are required if a user wants to view a program on a channel and at the same time record another program on another channel, that is, if a plurality of channels are to be demodulated at the same time. Such a use demands a larger scale of a receiving apparatus. Also, if the video data contained in a program on a channel are coded by MPEG (Moving Picture Expert Group) or the like, there will result a certain amount of delay in the decoding processing. As a consequence, when a channel selection is changed, it may take time before the first of the images is displayed.

SUMMARY OF THE INVENTION

The present invention has been made in view of the foregoing circumstances and an objective thereof is to provide a receiving technology for executing a parallel processing of a plurality of channels.

In order to solve the above problems, a receiving apparatus according to an embodiment of the present invention comprises: a receiver which receives a radio-frequency signal in which a plurality of channels are frequency-multiplexed; a conversion unit which converts the radio-frequency signal received by the receiver, into a digital signal; and a processing unit which processes respectively the plurality of channels contained in the digital signal converted by the conversion unit. The processing unit includes: a band-pass filter, having bands corresponding respectively to the plurality of frequency-multiplexed channels, which separates the digital signal into a plurality of channels; and a demodulation unit which demodulates respectively the plurality of channels separated by the band-pass filter.

To "convert the radio-frequency signal into a digital signal" includes also a case when the radio-frequency signals are converted to the digital signals via intermediate frequencies, in addition to a case when the radio-frequency signals are directly converted to the digital signals. That is, it is only necessary that the radio-frequency signals are inputted and the digital signals are finally outputted. According to this embodiment, the radio-frequency signals are converted to the digital signals as they are, then the thus converted digital signals are separated channel by channel and, thereafter, the thus separated channels are processed. Hence, the processing for a plurality of channels can be executed in parallel.

The processing unit may include: a software program having functions of band-pass filter and demodulation unit; and a plurality of processors which execute the software program. Each of the plurality of processors may be assigned at least one of a plurality of processing contents included in the function in the software program and at the same time the at least one of a plurality of processing contents may be fixedly stored in an internal cache. "Processing contents" correspond to an operation carried out by at lest one module that constitutes a function to realize the function.

Another preferred embodiment according to the present invention relates to a receiving method. This is a method in which a radio-frequency signals where a plurality of channels are frequency-multiplexed is received and the received radio-frequency signal is converted to a digital signal and, thereafter, a plurality of channels included in the converted digital signal are respectively processed, and the method is such that the digital signal is separated into a plurality of channels by a band-pass filter having bands corresponding respectively to a plurality of frequency-multiplexed and then the plurality of separated channels are demodulated, respectively.

It is to be noted that any arbitrary combination of the above-described structural components and the expressions changed among a method, an apparatus, a system, a recording medium, a computer program and so forth are all effective as and encompassed by the present embodiments.

Moreover, this summary of the invention does not necessarily describe all necessary features so that the invention may also be sub-combination of these described features.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which:

FIGS. 4A to 4C are brief diagrams for explaining access from each sub-processor to a main memory shown in FIG. 3.

DETAILED DESCRIPTION OF THE INVENTION

Before describing the present invention in a specific manner, an outline of the present invention will be described first. An embodiment of the present invention relates to a receiving apparatus that receives radio-frequency signals in digital television broadcasting and reproduces a program contained in the received radio-frequency signals. A plurality of channels are contained in radio-frequency signals in digital television broadcasting. A receiving apparatus according to the present embodiment is structured as described below so as to perform processings on the plurality of channels contained in the radio-frequency signals. The receiving apparatus carries out a frequency conversion from received radio-frequency signals to intermediate-frequency signals. In doing so, the receiving apparatus performs a frequency conversion in a manner that none of the plurality of channels contained therein is particularly selected but all of the plurality of channels are contained. Also, a plurality of band-pass filters corresponding to the plurality of channels, respectively, are provided, with which the intermediate-frequency signals are separated into a plurality of channels. The receiving apparatus reproduces programs by executing demodulation processing and MPEG decoding to each of the plurality of separated channels. Moreover, it outputs a program corresponding to any one of the channels.

Figure 1:
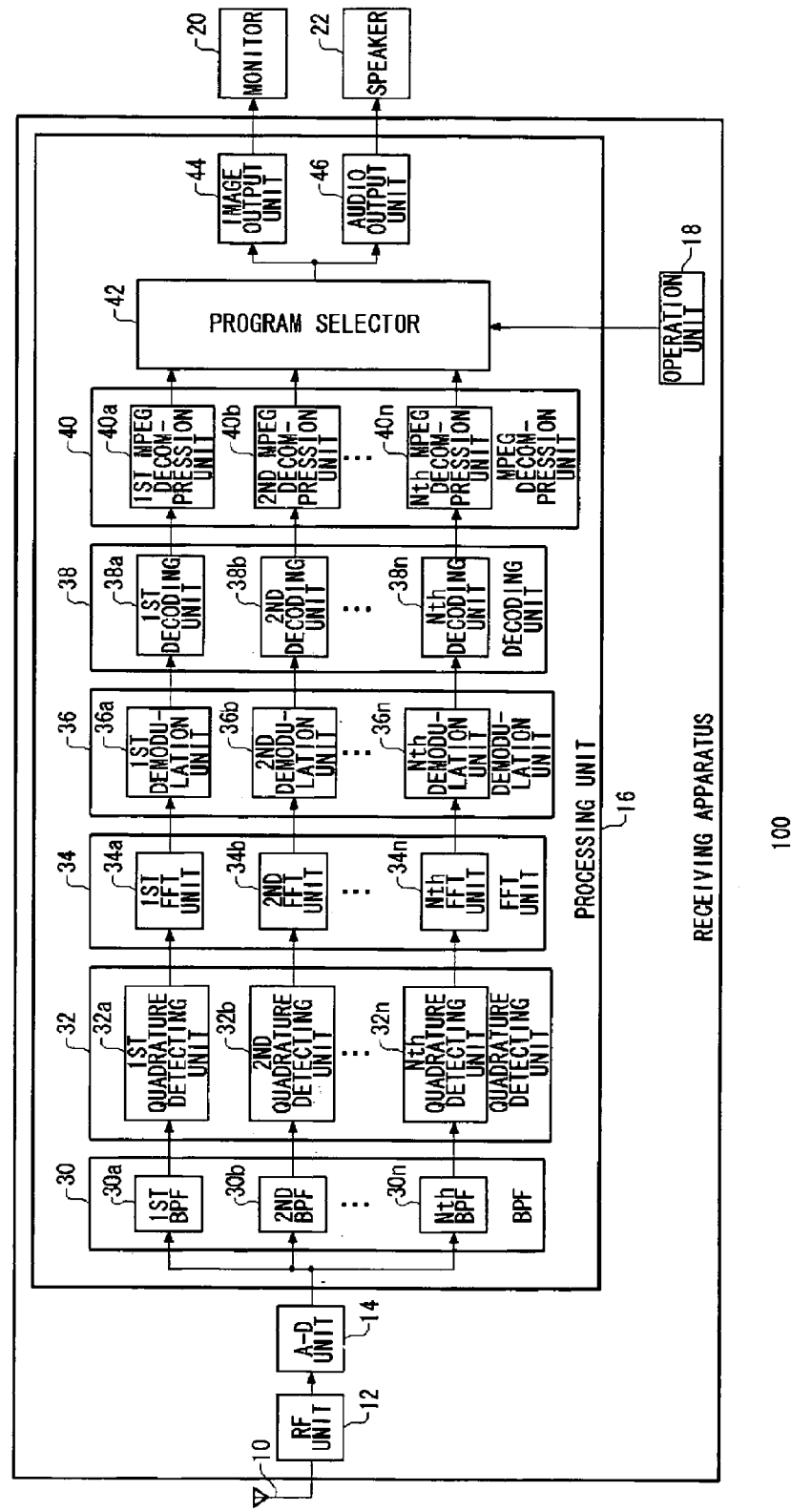
FIG. 1 illustrates a receiving apparatus according to an embodiment of the present invention.

FIG. 1 illustrates a structure of a receiving apparatus 100 according to an embodiment of the present invention. The receiving apparatus 100 includes an antenna 10, an RF unit 12, an A-D unit 14, a processing unit 16 and an operation unit 18. The processing unit 16 includes a first BPF 30a, a second BPF 30b, . . . and an Nth BPF 30n, which are generically referred to as "BPF (Band-Pass Filter) 30", a first quadrature detection unit 32a, a second quadrature detection unit 32b, . . . and an Nth quadrature detection unit 32n, which are generically referred to as "quadrature detection unit 32", a first FFT unit 34a, a second FFT unit 34b, . . . and an Nth FFT unit 34n, which are generically referred to as "FFT (Fast Fourier Transform) unit 34", a first demodulation unit 36a, a second demodulation unit 36b, . . . and an Nth demodulation unit 36n, which are generically referred to as "demodulation unit 36", a first decoding unit 38a, a second decoding unit 38b, . . . and an Nth decoding unit, which are generically referred to as "decoding unit 38", a first MPEG decompression unit 40a, a second MPEG decompression unit 40b, . . . and an Nth MPEG decompression unit 40n, which are generically referred to as "MPEG decompression unit 40", a program selector 42, a video output unit 44 and an audio output unit 46. The receiving apparatus 100 is connected with a monitor 20 and a speaker 22.

Figure 2A:
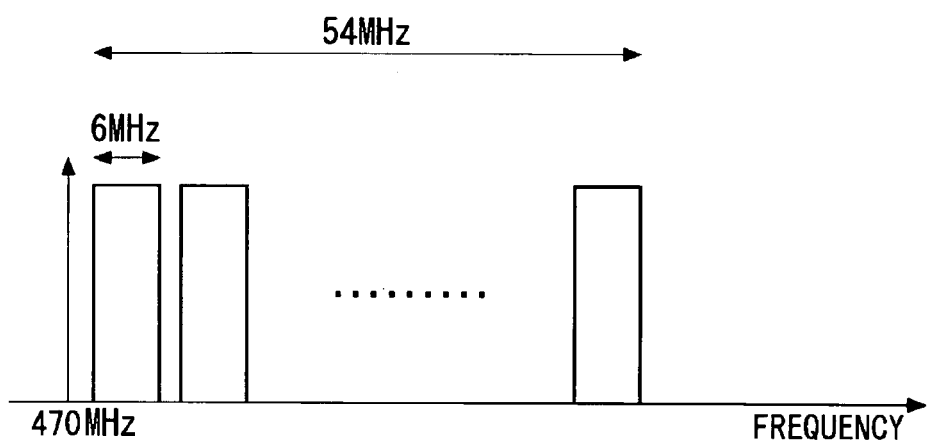
FIGS. 2A and 2B show the spectrums of signals processed at the receiving apparatus shown in FIG. 1.
Figure 2B:
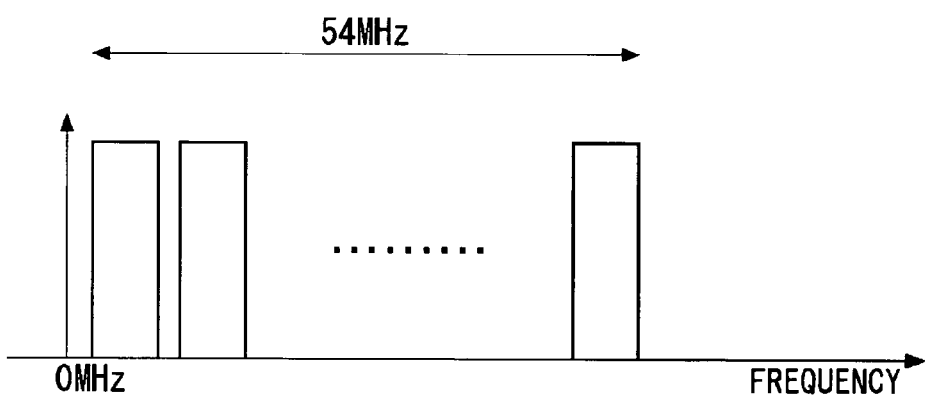

The RF unit 12 receives radio-frequency signals carrying a plurality of frequency-multiplexed channels via the antenna 10. As aforementioned, the radio-frequency signals are compatible with digital television broadcasting. The RF unit 12 changes the radio-frequency signals into the intermediate-frequency signals in such a manner that none of the plurality of channels is selected but the plurality of channels are contained therein. FIGS. 2A and 2B show the spectrums of signals processed at the receiving apparatus 100. FIG. 2A shows a spectrum of radio-frequency signals received by the RF unit 12. In FIG. 2A, the horizontal axis is frequency. It is assumed here that the plurality of channels contained are nine channels. Since the bandwidth of a channel is defined as "6 MHz", the bandwidth of the radio-frequency signals is defined as "54 MHz".

Accordingly, the radio-frequency signals are located in the band from "470 MHz" to "524 MHz". It is further assumed that one channel is constituted by a plurality of subcarriers in an OFDM (Orthogonal Frequency Division Multiplexing) scheme. Here, the number of channels contained in the radio-frequency signals may not necessarily be "9". FIG. 2B shows a spectrum of intermediate-frequency signals which have been frequency-converted by the RF unit 12. As illustrated in FIG. 2B, the intermediate-frequency signals have a plurality of channels in the same way as the radio-frequency signals. The intermediate-frequency signals are located in the band from "0 MHz" to "54 MHz".

Now refer back to FIG. 1. The A-D unit 14 converts the intermediate-frequency signals, which have been converted from radio-frequency signals by the RF unit 12, into digital signals. The A-D unit 14 carries out this conversion to the digital signals by the use of sampling frequencies that can directly convert the intermediate-frequency signals containing the aforementioned plurality of channels into digital signals. The processing unit 16 processes each of the plurality of channels contained in the digital signals which have been converted by the A-D unit 14. Here, the processing unit 16 performs the processing as described below, using a program installed in a processor.

A plurality of BPFs 30 have their respective bands corresponding to the plurality of frequency-multiplexed channels. The BPFs 30 receive the input of digital signals having been converted by the A-D unit 14 and separate them into signals corresponding respectively to the plurality of channels. The BPFs 30 are each constituted by an FIR (Finite Impulse Response) filter, for instance. The quadrature detection unit 32 performs quadrature detection of the signals corresponding respectively to the plurality of channels. Consequently, the quadrature detection unit 32 outputs baseband signals corresponding respectively to the plurality of channels. Note that a baseband signal, which is formed by an in-phase component and a quadrature component, should be indicated by two signal lines. Here, however, it is indicated by a single signal line for the clarity of the figure.

The FFT units 34 performs fast Fourier transform on the baseband signals outputted from the quadrature detection units 32. That is, the FFT units 34 convert time-domain signals into frequency-domain signals. The demodulation units 36 demodulate signals that have been fast-Fourier-transformed by the FFT units 34. It is to be noted that the demodulation units 36 carry out demodulation that corresponds to a predetermined modulation scheme. The decoding units 38 decode signals that have been demodulated by the demodulation units 36. The decoding performed by the decoding units 38 is to be understood to correspond to the scheme of coding done by a transmitting apparatus (not shown). It is to be understood that the signals decoded by the decoding units 38 have been MPEG-coded by a transmitting apparatus (not shown). In other words, a program transmitted on a channel is MPEG-coded. The MPEG decompression units 40 carry out an MPEG decoding on the signals having been decoded by the decoding units 38. As a result, video data and audio data contained in the program are outputted from the MPEG decompression units 40.

The operation unit 18 receives an instruction about the selection of a program from a user. The operation unit 18, which has a plurality of buttons or the like, receives an instruction as the user selects a button corresponding to the program he/she has desires. The operation unit 18 outputs the received instruction to the program selector 42. Based on the instruction from the operation unit 18, the program selector 42 selects at least one of a plurality of programs that have been decoded by the MPEG decompression units 40. The program selector 42 outputs the program it has selected. The video output unit 44 outputs video data of the selected program to the monitor 20, where the video data are reproduced. The audio output unit 46 outputs audio data of the selected program to the speaker 22, where the audio data are reproduced. By implementing this structure, if the operation unit 18 receives an instruction for a newly selected program from the user, the program selector 42 will immediately output the newly selected program because the MPEG decompression units 40 have already reproduced the newly selected program. Accordingly, the user can immediately watch and hear the newly selected program via the monitor 20 and the speaker 22.

In terms of hardware, the above-described structure can be realized by a CPU, a memory and other LSIs of an arbitrary computer. In terms of software, it is realized by memory-loaded programs or the like, but drawn and described herein are function blocks that are realized in cooperation with those. Thus, it is understood by those skilled in the art that these function blocks can be realized in a variety of forms such as by hardware only, software only or the combination thereof.

As described earlier, the software program installed in the processing unit 16 has the functions of the BPFs 30, demodulation units 36 and so forth. The processing unit 16 is provided with a plurality of processors to run the software program. The detail of the plurality of the processors will be described later. To put it simply, at least one of a plurality of processing contents included in the functions of the software program is assigned to each of the plurality of processors. The contents of processing, or processing contents, meant here is, for instance, equal to the processing at the BPF 30, the processing at the quadrature detection unit 32 or the like. The plurality of processors store at least one allotted content of processing fixedly in internal cache memory. For example, the processing of the BPF 30 is assigned to one processor. The detail of the processing unit 16 will be explained below.

Figure 3:
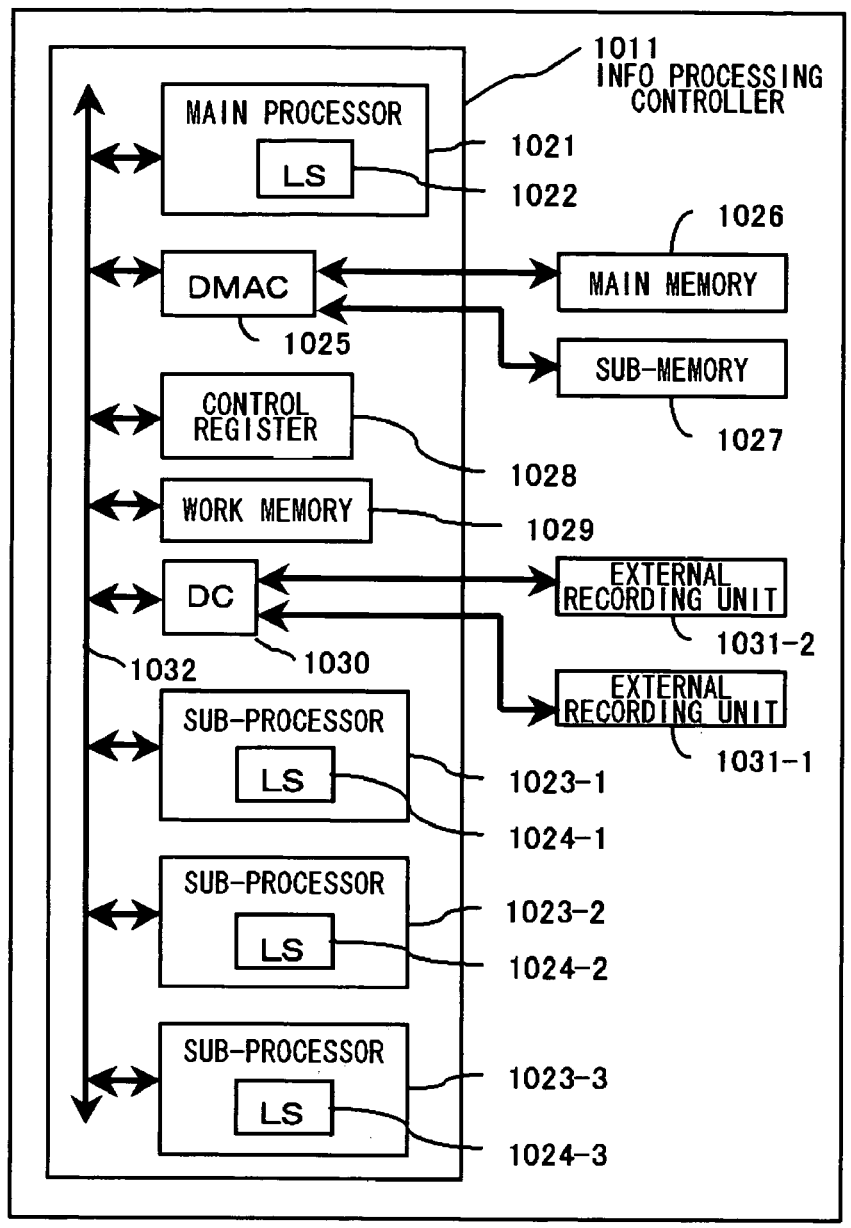
FIG. 3 illustrates a structure of a processing unit shown in FIG. 1.

FIG. 3 illustrates a structure of a processing unit 16. The processing unit 16 includes an information processing controller 1011, a main memory 1026, a sub-memory 1027, and a first external recording unit 1031-1 and a second external recording unit 1031-2, which are generically referred to as "external recording unit 1031". The information processing controller 1011 includes a main processor 1021, a DMAC 1025, a control register 1028, a work memory 1029, a DC 1030, a first sub-processor 1023-1, a second sub-processor 1023-2 and a third sub-processor 1023-3, which are generically referred to as "sub-processor 1023", and a bus 1032. The main processor 1021 includes an LS (Local Storage) 1022, the first sub-processor 1023-1 includes an LS 1024-1, the second sub-processor 1023-2 includes an LS 1024-2, and the third sub-processor 1023-3 includes an LS 1024-3.

The main processor 1021 performs a schedule management of the sub-processor program execution (data processing) by the first sub-processor 1023-1, the second sub-processor 1023-2 and the third sub-processor 1023-3, and performs a general management of the information processing controller 1011. However, it can also be arranged such that a program other than a managing program runs in the main processor 1021. In such a case, the main processor 1021 will function as a sub-processor also.

There may be only one sub-processor 1023, but preferably two or more. The present example is a case of two or more sub-processors 1023. The first sub-processor 1023-1, the second sub-processor 1023-2 and the third sub-processor 1023-3 process data by running their respective sub-processor programs in parallel and independently under the control of the main processor 1021. Moreover, if necessary, it can also be arranged such that a program in the main processor 1021 runs in linkage with the sub-processor programs in the sub-processors 1023. The function program to be described later is also a program that runs in the main processor 1021.

The DMAC 1025 accesses programs and data stored in the main memory 1026, which is comprised of a DRAM (dynamic RAM) or the like connected to the information processing controller 1011 and stored in the sub-memory 1027, which is comprised of an SRAM (static RAM) or the like connected thereto in a similar manner. Through the DMAC 1025, a high-speed data transfer in a DMA method can be realized between each of the sub-processors 1023 and the main memory 1026. The control register 1028 determines which of the sub-processors 1023, and further which of the processing threads (to be discussed later), which exist in plural numbers in the sub-processor 1023, processes the sub-processor program to be processed within the information processing controller 1011, and is at the same time used to manage the progress of the sub-processor program run by the sub-processor 1023. The work memory 1029 is a memory, used for working, which is comprised of an SRAM or the like included in the information processing controller 1011, and is accessed by the main processor 1021 and the sub-processors 1023.

The DC 1030 accesses the first external recording unit 1031-1 and the second external recording unit 1031-2, both connected to the information processing controller 1011. The external recording unit 1031 may be either a fixed disk (hard disk) or a removable disk and may further come in any of various forms, such as optical disk (MO, CD±RW, DVD±RW, etc.), memory disk, SRAM (static RAM) and ROM. Hence, the DC 1030, which is normally called a disk controller, is a controller of external recording units.

As with the example shown in FIG. 3, an information processing controller 1011 may be configured such that a plurality of external recording units 1031 are connected thereto. The main processor 1021, the sub-processors 1023, the DMAC 1025, the control register 1028, the work memory 1029 and the DC 1030 are connected with one another via a bus 1032. Identifiers that can identify the main processor 1021 and the sub-processors 1023, respectively, are assigned as the main processor ID and the sub-processor IDs. It is preferable that the information processing controller 1011 be formed as a single-chip IC (integrated circuit).

A description is now given of the access from the sub-processors 1023 to the main memory 1026. As already explained, the sub-processors 1023 in the information processing controller 1011 run their respective sub-processor programs and process data independently of each other. Therefore, a mismatching of data can occur if different sub-processors attempt a reading or writing to the same area in the main memory 1026 simultaneously. Thus, the access from the sub-processors 1023 to the main memory 1026 is done using the procedure as will be explained below. Similarly for the sub-memory 1027 and the work memory 1029, it is possible that different sub-processors 1023 access the same memory area thereof simultaneously. Here, it explains the access to the main memory 1026.

The respective processings of BPFs 30 or the like included in a processing unit 16 as shown in FIG. 1 are fixedly disposed in the main processor 1021 and sub-processors 1023. In other words, both programs and data for executing processings of BPFs 30 or the like included in a processing unit 16 are stored fixedly in the LS 1022, LS 1024 and the like.

FIGS. 4A to 4C are brief diagrams for explaining the access from the sub-processors 1023 to the main memory 1026. As illustrated in FIG. 4A, the main memory 1026 is comprised of a plurality of memory locations 0 to N which can be addressed. Additional segments 0 to N for storing information which indicates the state of data are assigned to the respective memory locations. An additional segment contains an F/E bit, sub-processor ID and LS (Local Storage) address. Furthermore, access keys 0 to N to be explained later are also assigned to the respective memory locations. The full/empty (F/E) bit is defined as follows.

F/E bit=0 indicates that the data is being read and processed by a sub-processor 1023 or is in a free state and therefore it is an invalid data, which is not the latest data, and is not readable. Also, F/E bit=0 indicates that data is writable in an applicable memory location, and is set to 1 after the writing. F/E bit=1 indicates that the data in the said memory location has not been read out by a sub-processor 1023 and is the latest unprocessed data. The data in said memory location is readable and is set to 0 after it is read out by a sub-processor 1023. Also, F/E bit=1 indicates that data is not writable in said memory location. Furthermore, it is possible to set a read-reservation on said memory location when F/E bit=0 (not readable/writable). To set a read-reservation on a memory location of F/E bit=0, a sub-processor 1023 writes the sub-processor ID and LS address of said sub-processor 1023 in the additional segment of the memory location to be read-reserved, as read-reserved information.

Then data is written in the read-reserved memory location by the data-writing sub-processor 1023, and when F/E bit=1 (readable/not writable) is set, the data is read out to the sub-processor ID and LS address which have been written in the additional segment as read-reservation information in advance. Where it is necessary to process data in multiple stages by a plurality of sub-processors 1023, controlling the read/write of data in each memory location as described above will make it possible that immediately after a sub-processor 1023 performing a previous-stage processing writes an already-processed data in a predetermined address in the main memory 1026, another sub-processor 1023 performing a subsequent-stage processing reads out the data after the previous processing.

As illustrated in FIG. 4B, the LS 1024 in each sub-processor 1023 is also comprised of a plurality of memory locations 0 to L which can be addressed. Similarly, additional segments 0 to L are allotted to the respective memory locations. It is to be understood that an additional segment includes a busy bit. When a sub-processor 1023 reads data in the main memory 1026 to a memory location of its own LS 1024, the sub-processor 1023 makes a reservation by setting the busy bit corresponding to the memory location of a read destination to 1. Other data cannot be stored in the memory location for which the busy bit is 1. After the readout to the memory location of the LS 1024, the busy bit becomes 0 and now can be used for arbitrary purposes.

As illustrated in FIG. 4A, the main memory 1026 connected to each information processing controller further includes a plurality of sandboxes. Each of the sandboxes, which demarcate the areas within the main memory 1026, is allocated to each of the sub-processors 1023, and said sub-processor can use it exclusively. That is, each sub-processor 1023 can use a sandbox assigned thereto but cannot access data beyond the area. The main memory 1026 is comprised of a plurality of memory locations 0 to N, and a sandbox is an assemblage of these memory locations. In other words, a sandbox is formed by one or more memory locations.

Furthermore, to realize an exclusive control of the main memory 1026, a key management table as illustrated in FIG. 4C is used. The key management table is stored in a relatively high-speed memory, such as SRAM, in the information processing controller 1011 and associated with the DMAC 1025. It may also be stored in the work memory 1029. In the key management table there are the same number of entries as that of the sub-processors 1023 in the information processing controller 1011, and stored in each entry are a sub-processor ID and the corresponding sub-processor key and key mask, which are associated with each other. The process of a sub-processor 1023 using the main memory 1026 is as described below. First a sub-processor 1023 transmits a read or write command to the DMAC 1025. This command includes its own sub-processor ID and an address in the main memory 1026, which is the destination of access request.

Before executing this command, the DMAC 1025 checks and examines the sub-processor key of the sub-processor 1023, which is the origin of access request, by referring to the key management table. Then the DMAC 1025 compares the checked sub-processor key of the origin of access request with the access key allotted to the memory location as shown in FIG. 4A in the main memory 1026, which is the destination of access request, and executes the above-mentioned command only when the two keys agree with each other.

The key masks on the key management table as shown in FIG. 4C are of such design that when an arbitrary bit thereof becomes 1, the bit corresponding to the sub-processor key associated with the key mask can become 0 or 1. Let us assume here that the sub-processor key is 1010. Normally, this sub-processor key enables access to a sandbox that has the access key of 1010 only. However, where the key mask associated with this sub-processor key is set to 0001, the decision on agreement between the sub-processor key and the access key is masked for only the digits where the key mask bit is set to 1, and thus the 1010 of this sub-processor key enables the access to the sandboxes whose access key is either 1010 or 1011.

As described above, the exclusivity of sandboxes of the main memory 1026 is realized. That is, where it is necessary to process data in multiple stages by a plurality of sub-processors 1023 in the information processing controller 1011, the above-described arrangement allows only a sub-processor 1023 performing a previous-stage processing and a sub-processor 1023 performing a subsequent-stage processing to access predetermined addresses in the main memory 1026, thus protecting the data. An example of use is as follows. Firstly, the values of key masks immediately after the startup of the processing unit 16 are all zeroes.

It is assumed here that a program in the main processor 1021 runs and operates in linkage with the sub-processor programs in the sub-processors 1023. When the result data of processing executed by the first sub-processor 1023-1 is to be stored once in the main memory 1026 and then to be transmitted to the second sub-processor 1023-2, it is of absolute necessity that the applicable area of main memory is accessible by both the sub-processors 1023. In such a case, the program in the main processor 1021 enables the processing in multiple stages by the sub-processors 1023 by providing a main memory area accessible from the plurality of sub-processors by properly changing the values of the key masks.

Next, a description will be given of the access from each sub-processor 1023 to the main memory 1026 and the sub-memory 1027. Each of the sub-processors 1023 in the information processing controller 1011 can perform a readout from or a write to the sub-memory 1027 as with the main memory 1026. However, it is conceivable that there are a number of command types with varying degrees of priority. The following is a procedure for each of the sub-processor 1023 to use the main memory 1026 and the sub-memory 1027 correctly.

Figure 5:
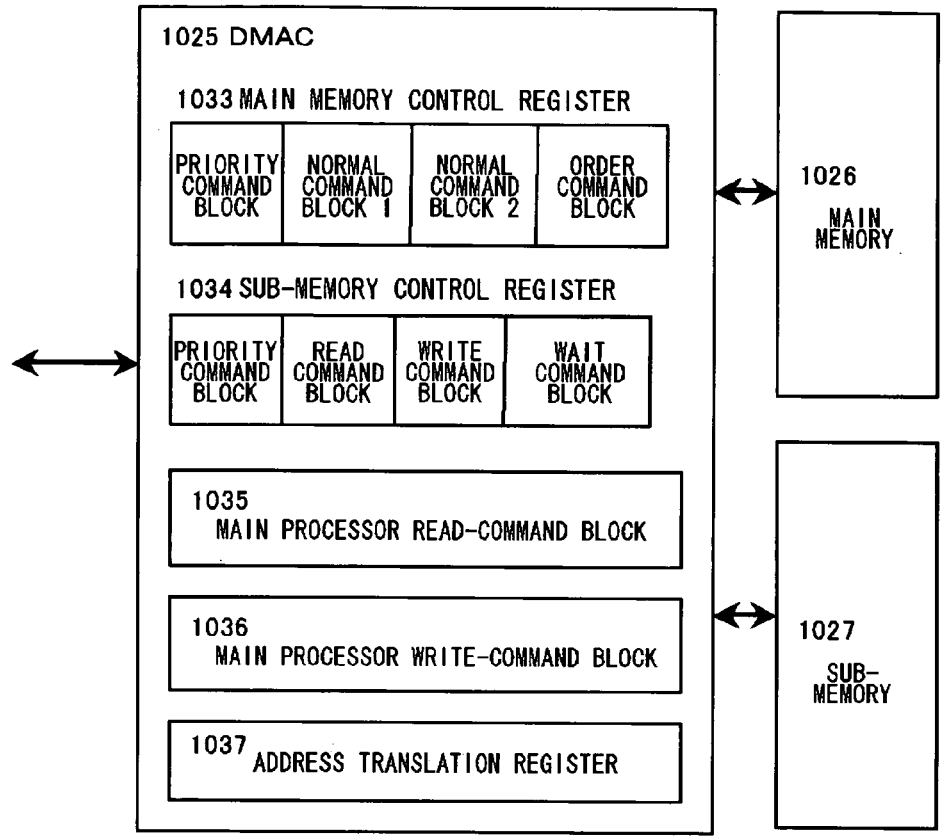
FIG. 5 illustrates structures of a DMAC, a maim memory and a sub-memory of FIG. 3.

FIG. 5 illustrates structures of a DMAC 1025, a main memory 1026 and a sub-memory 1027. The DMAC 1025 includes a main memory control register 1033, a sub-memory control register 1034, a read-command block 1035 for use with main processor, a write-command block 1036 for use with main processor and an address translation register 1037.

The DMAC 1025 has a main memory control register 1033 and a sub-memory control register 1034 therewithin. The main memory control register 1033 is a register used to access the main memory 1026, and the sub-memory control register 1034 is one to access the sub-memory 1027. Firstly, a procedure for the use of the main memory control register 1033 is described. The main memory control register 1033 is comprised of four blocks, each of which stores a command for access to the main memory 1026 as follows.

(1) Priority command block: A plurality of commands of higher priority are stored. The commands in this block are processed preferentially.
(2) Normal command block 1: A plurality of normal commands are stored.
(3) Normal command block 2: Similarly, a plurality of normal commands are stored. There is no functional difference between normal command block 1 and normal command block 2. However, if, for instance, commands before access to the main memory 1026 are stored in one of the blocks and those thereafter are stored in the other thereof, an effect will be achieved in which the commands before and after the access execution can each be processed concentratedly and continuously.
(4) Order command block: A plurality of commands, which must be processed in a correct order, are stored. That is, the commands from the sub-processors 1023 are stored in the reception order together with the sub-processor identifiers, which are the command originators. In this manner, commands can be processed in the order of reception and the results of execution can be transmitted back to the sub-processors 1023 of command originators in the same order.

Now, a procedure for the use of a sub-memory control register 1034 is described. The sub-memory control register 1034 is also comprised of four blocks, each of which stores commands for access to the sub-memory 1027 as follows.
(1) Priority command block: A plurality of commands of higher priority are stored. The commands in this block are processed preferentially.
(2) Read command block: A plurality of read commands are stored.
(3) Write command block: A plurality of write commands are stored.
(4) Wait command block: A plurality of commands, with which access to an arbitrary area in the sub-memory 1027 has been attempted but has failed because of a locked target area, are stored. The commands are moved to the priority command block when the lock is canceled.

Figure 6:
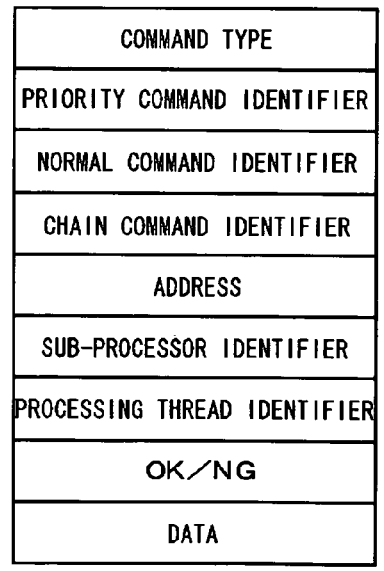
FIG. 6 shows a data structure of commands shown in FIG. 5.

And each of the sub-processors 1023 accesses the main memory 1026 or the sub-memory 1027 using a command as exemplified in FIG. 6. FIG. 6 shows the data structure of a command. The response of an execution result from the main memory 1026 or the sub-memory 1027 after an access execution is also made in the same structure. In these command and response, there are read and write command types. A priority command identifier indicates the high priority of the command. A normal command identifier, which is at an access to the main memory 1026, indicates that said command is stored in a normal command block 1 or 2. A chain command identifier, which is also at an access to the main memory 1026, indicates that the command requires a continuous access together with the command immediately before or after it. Or it may be a serial number in the sequence of consecutive commands.

Although a command with a chain command identifier set therein is stored in the order command block, the priority of processing thereof should be higher than that of the commands in the order command block. The address indicates an address in the main memory 1026 or the sub-address that executes the command. It may also be an address in the work memory 1029. A sub-processor identifier is an identifier of a sub-processor 1023, which is a command originator. A processing thread identifier is an identifier of processing thread, which is a command originator, the details of which will be described later. OK/NG indicates the success or failure of a command. Data is either the read data contained in the response at the execution of a read command or the written data contained in the command at the execution of a write command.

Now refer back to FIG. 5. It is also conceivable that in addition to a main memory control register 1033 for an accurate access of each sub-processor 1023 to the main memory 1026 and similarly a sub-memory control register 1034 for an accurate access to the sub-memory 1027, a read command block 1035 for the main processor and a write command block 1036 for the main processor, both capable of storing a plurality of read commands and write commands for the main processor 1021 to access the main memory 1026 or the sub-memory 1027, are provided in the information processing controller 1011.

Furthermore, the following procedure is assumed to be followed when a plurality of sub-processors transmit commands of the same priority at the same time to the DMAC 1025. That is, the DMAC 1025 has therewithin a pointer that indicates the latest sub-processor 1023 that has succeeded in memory access. And when the memory access commands of the same priority are received from a plurality of sub-processors 1023 at the same time, priority is given to the commands from sub-processors 1023 whose value is larger than that of said pointer and whose difference is smaller. At this time, the largest pointer value will be followed by the smallest pointer value.

Figure 7:
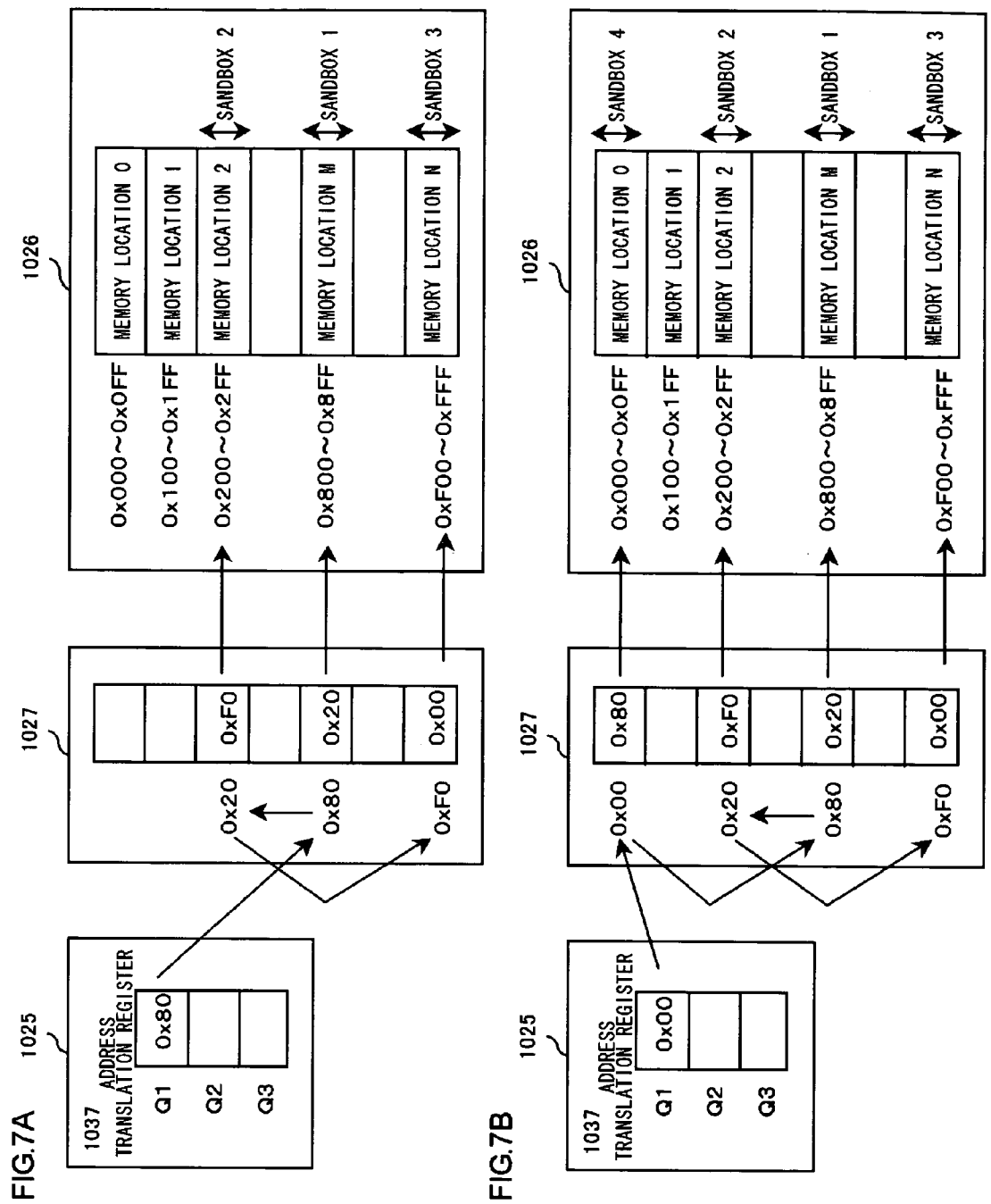
FIGS. 7A and 7B illustrate another configurations of a DMAC, a main memory and a sub-memory.

Next, a description is given of the access to the sub-memory 1027 to enable an accurate access from each sub-processor 1023 to the main memory 1026. It goes without saying that the main memory 1026, comprised of DRAM or the like, and the sub-memory 1027, comprised of SRAM or the like, have different purposes of use resulting from the different structures of the elements. One example of a combined use of the main memory 1026 and the sub-memory 1027 is the sub-memory 1027 carrying out the address conversion when each of the sub-processors 1023 accesses the main memory 1026. The procedure therefore is described using FIGS. 7A and 7B. FIGS. 7A and 7B illustrate another configurations of the DMAC 1025, the main memory 1026 and the sub-memory 1027.

As described already, the main memory 1026 is formed by a plurality of memory locations, and a sandbox is made up of one or more memory locations. And each sub-processor 1023 can use the sandboxes assigned thereto exclusively. It is assumed here, for instance, that sandboxes 1, 2 and 3 in the main memory 1026 are assigned to the sub-processors 1023 in the information processing controller 1011. It is also assumed that the areas of sandboxes 1, 2 and 3 are 0x200 to 0x2FF, 0x800 to 0x8FF and 0xF00 to 0xFFF, respectively, and that each of these sandboxes is identified by the top address. Which means that it is not necessary that the assigned sandboxes have consecutive addresses.

In FIG. 7A, when reading out the data from the sandboxes 1, 2 and 3, the sub-processor 1023 first accesses an address translation register 1037 in the DMAC 1025. The address translation register 1037 is a register in which the sub-processor 1023 and the sandbox assigned to said sub-processor 1037 are associated with each other. And the address translation register 1037 is constituted by the same number of entries as that of sub-processor 1023. It is assumed here that an entry denoted by Q1 corresponds to said sub-processor 1023. The sub-processor 1023 reads out a value of Q1 corresponding to the sub-processor 1023 itself. Then, the data (0x20) is read out from the first address in the sub-memory 1027 indicated by the read-out value (0x80)) of Q1. Here, an area of the sandbox 1 can be identified based on the value of Q1. For example, when the value of Q1 is 0x80, it is conceivable that a value (0x800) of the value of Q1 times 16 indicates the top address of the sandbox 1. Then a value (0x8FF) obtained after 255 is added to said top address will be the ending address.

Data (0xF0) is read out from the second address in the sub-memory 1027 indicated by the data (0x20) from the first address in the same sub-memory 1027. Here, in the similar manner, the sandbox 2 can be identified based on the data (0x20) read out from the first address in the sub-memory 1027. That is, the area covering 0x200 through 0x2FF in the main memory 1026 is equivalent to the sandbox 2. Data (0x00) is read out from the third address in the sub-memory 1027 indicated by the data (0xF0) read out from the second address in the sub-memory 1027. 0x00 indicates the end of an assigned sandbox. Similarly, the sandbox 3 can be identified based on the data (0xF0) read out from the second address in the sub-memory 1027. That is, the area covering 0xF00 through 0xFFF in the main memory 1026 is equivalent to the sandbox 3. Data can be read out from the sandboxes 1, 2 and 3 which have been identified as above. In this manner, each sub-processor 1023 can be accurately accessed even if the address assigned thereto is noncontiguous.

Next, referring to FIG. 7B, a procedure with which the same sub-processor 1023 writes data to a new sandbox in the main memory 1026 and said sandbox is added to a group of sandboxes managed by Q1 in an address translation register 1037 will be described. Suppose that said sub-processor 1023 wrote data to a sandbox 4 which is an area covering 0x000 through 0x0FF in the main memory 1026. Then, Q1 is read out first (with the initial at 0x80). Then the sandbox 4 that wrote data anew can be identified. The value of Q1 previously read out is written to an address, in the sub-memory 1027, which can identify the sandbox that has written data anew. For example, since the data is written to an area covering 0x000 through 0x0FF, it is conceivable that the value (0x80) of Q1 is written to the address, in the sub-memory 1027 indicated by 0x00 obtained when 0x000 is divided by 16, which is the header address. Then the address (0x00) in the sub-memory, to which the value (0x80) of Q1 has been written, is written to Q1 in the address translation register 1037, as a new value of Q1.

In the above described manner, each sub-processor 1023 can add a new sandbox to a group of the existing sandbox belongs. In this case, too, the address of each sandbox may be noncontiguous. The above method can also be applied to a case when there is no existing sandbox and the first sandbox is associated with the sub-memory 1027 and the address translation register 1037.

Next, a description will be given of an access from the main processor 1021 and each sub-processor 1023 to the work memory 1029. As described earlier, the main memory 1026 is comprised of a DRAM and the like, and data communication is performed through a DMA method, so that each sub-processor can use a large-capacity memory at high speed. A sub-memory 1027 is comprised of a SRAM and the like, and can be utilized at high speed, too. If the main processor 1021 and each sub-processor 1023 can use the main memory 1026 and sub-memory 1027, connected to the information processing controller 1011, as well as the work memory contained within the information processing controller in a sharing manner, then the processing at even higher speed can be achieved. If a simple arithmetic operation can be carried out by said work memory 1029, the processing will be done efficiently. As described earlier, the work memory 1029 is constituted by an SRAM and the like. Thus, because of the structure of this device, the work memory operates very fast even though a high capacity as in the DRAM cannot be expected.

Figure 8:
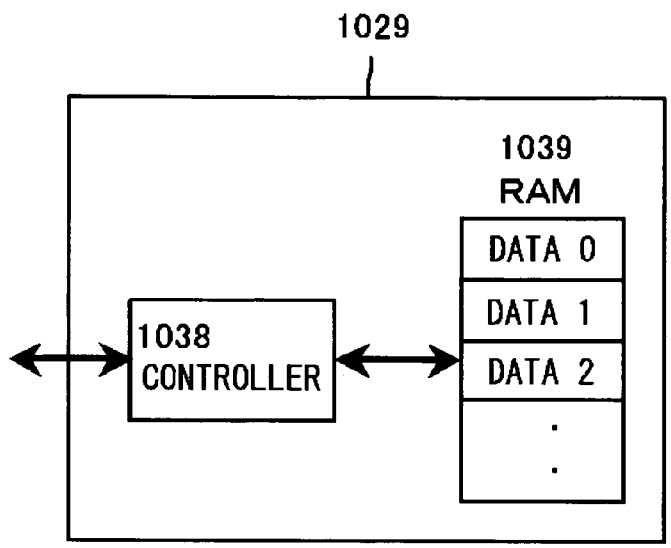
FIG. 8 illustrates a structure of a work memory shown in FIG. 3.

Now, a procedure for a case when the main processor 1021 and each sub-processor 1023 access the work memory 1029 will be described. FIG. 8 illustrates a structure of the work memory 1029. The work memory 1029 includes a controller 1038 and a RAM 1039. The RAM 1039 may be an SRAM or the like, but it is not limited thereto. The RAM 1039 is comprised of a plurality of blocks. Each block is assigned an address and can store data. The main processor 1021 and each sub-processor 1023 access the RAM 1039 via the controller 1038.

More specifically, the main processor 1021 and each sub-processor 1023 transmit commands, addresses, data or the like to the controller 1038. The controller 1038 accesses the RAM 1039 along with these. After an execution of processing, the controller 1038 follows a procedure where a result of command execution is sent back to the main processor 1021 or sub-processor 1023, which is the command originator. The commands used when each sub-processor 1023 accesses the work memory 1029 are, for example, those shown in FIG. 6, which are similar to those used when accessing main memory or sub-memory 1027. The response, after an execution of processing, to the execution result from the work memory 1029 is of a similar structure.

In a case when an access is made to the work memory 1029, however, the priority command identifier, normal command identifier, chain command identifier and processing thread identifier in the commands shown in FIG. 6 are basically not used. However, they may be used if the work memory 1029 can access these identifies. Several command types are conceivable which include:

(a) Read

This command is used to read out the data in the work memory 1029. The main processor 1021 and each sub-processor 1023 transmit also the addresses of blocks in a RAM with which to store desired data, together with the read commands. As a result of execution of this read command, an OK/NG indicative of success/failure of a read command and the read-out data are sent back.

(b) Write

This command is used to write the data to the work memory 1029. The main processor 1021 and each sub-processor 1023 transmit the write commands, data and addresses of blocks in a RAM with which to store said data. As a result of execution, an OK/NG indicative of success/failure of a write command is sent back.

(c) Add

This command is used to add the data in the work memory 1029. The main processor 1021 and each sub-processor 1023 transmit the add commands and addresses of blocks in a RAM with which to store data to be added up. The controller adds "1" to the data in the block of the address received and then overwrites it. As a result of execution, an OK/NG indicative of success/failure of an add command is sent back.

(d) Set

This command is used to operate the data in the work memory 1029 bit by bit. The main processor 1021 and each sub-processor 1023 transmit the set commands, address of blocks in a RAM with which to store the data to be operated, and mask data. The controller compares the received mask data with the data in the block of an address which was also received. The value of bit in the data located in the same position of a bit whose value is 1 in the mask data is set to "1". As a result of execution, "completed" indicative of the completion of a set command is set back. In this case, a structure may be such that the success/failure of a command can be confirmed by sending back the data before the execution of the set command.

(e) Clear

This command is used to operate the data in the work memory 1029 bit by bit. The main processor 1021 and each sub-processor 1023 transmit the clear commands, address of blocks in a RAM with which to store the data to be operated, and mask data. The controller compares the received mask data with the data in the block of an address which was also received. The value of bit in the data located in the same position of a bit whose value is 1 in the mask data is set to "0". As a result of execution, "completed" indicative of the completion of a clear command is set back. In this case, a structure may be such that the success/failure of a command can be confirmed by sending back the data before the execution of the clear command.

As described above, the main processor 1021 and each sub-processor 1023 can also use the work memory 1029 in addition to the large-capacity main memory 1026 and the high-speed sub-memory 1027. For example, higher speed can be expected to be realized if the work memory 1029 is utilized as a cache for the main memory 1026 and sub-memory 1027.

Figure 9:
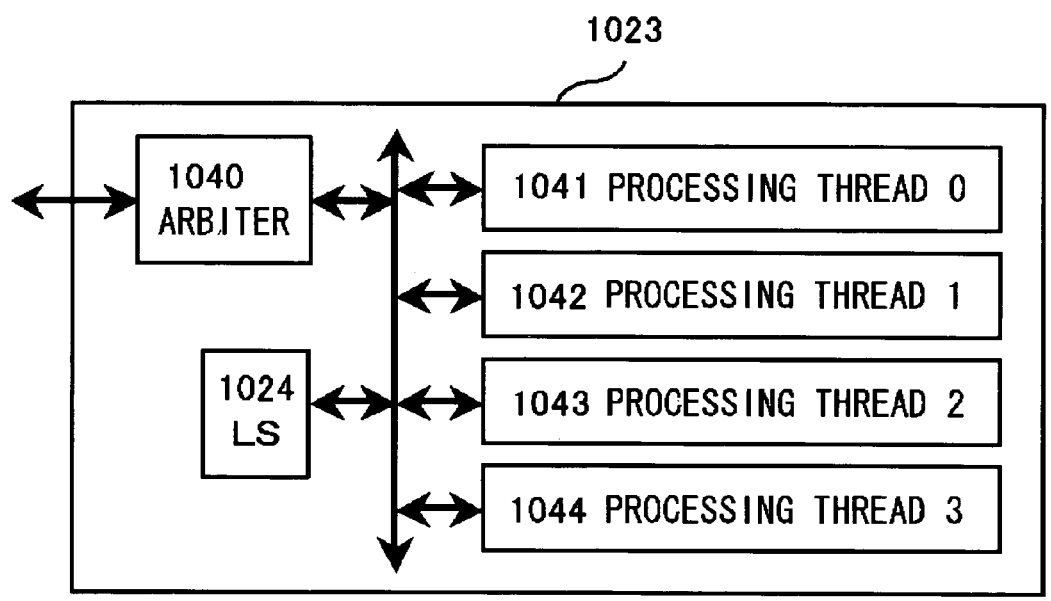
FIG. 9 illustrates a structure of a sub-processor shown in FIG. 3.

Next, a description will be given of a processing thread in each sub-processor 1023. As described earlier, each sub-processor 1023 in the information processing controller 1011 is structurally independent. Thus, each sub-processor 102 can run a sub-processor program independently and process data. It is also conceivable that each sub-processor 1023 has a plurality of virtually independent processing threads therewithin. FIG. 9 illustrates a structure of a sub-processor 1023. The sub-processor 1023 is connected to a bus 1032 via an arbiter 1040 included in the sub-processor 1023. The arbiter 1040 takes charge of conveying the signals from an external source, to an appropriate processing thread. The sub-processor 1023 further includes therein an LS 1024 and processing threads 0, 1, 2 and 3 (1041, 1042, 1043 and 1044, respectively). Though each processing thread is illustrated independently in FIG. 9, it is in fact a virtually independent entity. The processing threads are assigned processing identifiers, respectively, and are operable independently and in parallel with one another.

Here, in order for the processing thread to access the main memory 1026, sub-memory 1027 or work memory 1029 independently, it is required that a response be sent back unfailingly to a processing thread which is a command originator. A procedure for this purpose is as follows. A command used when each processing thread accesses each memory is shown in FIG. 6, for example. That is, the command is the same as that used when each sub-processor 1023 accesses a memory. The response to the execution result from each memory after an execution of processing is also of the same structure. In addition to the above description on FIG. 6 where a sub-processor identifier is the identifier for a sub-processor 1023 which is a command originator, the processing identifier serves also to identify which processing thread in said sub-processor 1023 is the command originator.

Based on the sub-processor identifier, the response from the main memory 1026, sub-memory 1027 or work memory 1029 is sent back first to the sub-processor 1023 which is the command originator. Then, based on the processing thread identifier, it is sent back to the processing thread which is the command originator, by the arbiter 1040 in the sub-processor 1023. Here, if any one of a plurality of processing threads in the sub-processor 1023 may be used, for example, if the same processing is to be carried out, the response may be sent back to a processing thread identifier whose processing load is light, without based on the processing thread identifier. Alternatively, whenever the response is received from the main memory 1026, sub-memory 1027 or work memory 1029, any one of a plurality of processing threads may be selected in sequence and then said response may be sent back to the selected processing thread. In such a manner as stated above, even if a plurality of processing threads in each sub-processor 1023 access the main memory 1026, sub-memory 1027 or work memory 1029 independently, the response can be unfailingly sent back to the processing thread which is the command originator.

Figures 10, 11:
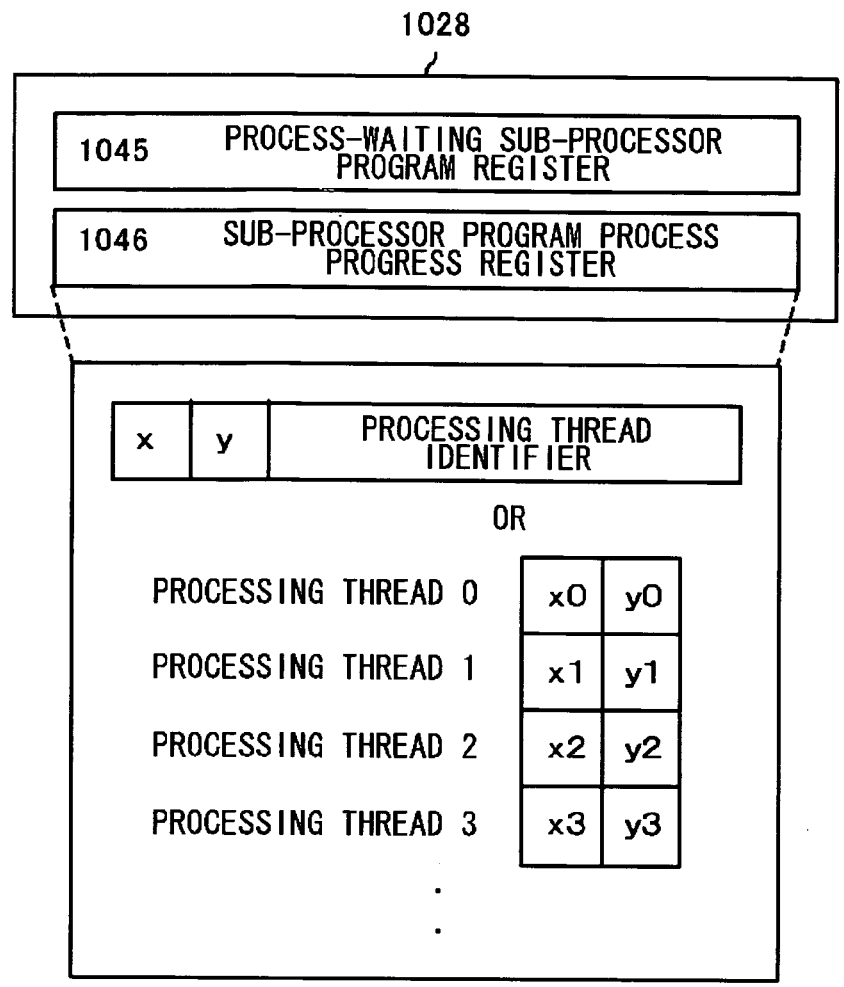
FIG. 10 illustrates a structure of a control register shown in FIG. 3.
FIG. 11 shows an example of screen display on a monitor of FIG. 1 at the time of selecting a program.

Next, a description will be given of management of sub-processor programs by the control register 1028. In the situation where there are a plurality of sub-processors 1023 and each sub-processor 1023 further contains a plurality of processing threads, in terms of realizing the high speed of an information processing controller it is extremely important to determine which processing thread is to be used to process a sub-processor program to be processed in the information processing controller 1011. Thus, a procedure will now be described in which an appropriate assignment of sub-processor program processing for each processing thread is realized and the information processing controller is efficiently operated. FIG. 10 illustrates a structure of the control register 1028. As shown in FIG. 10, the control register 1028 includes a process-waiting sub-processor program register 1045 and a sub-processor program progress register 1046.

A procedure for the use of the process-waiting sub-processor program register 1045 is described first. When there occurs a sub-processor program to be processed in the information processing controller 1011, the main processor 1021 writes to the process-waiting sub-processor program register 1045 the address in the main memory 1026, sub-memory 1027, work memory 1029 or LS where said sub-processor program or the related data is stored. In a situation where there is no sub-processor programs to be processed, the value of the process-waiting sub-processor program register 1045 is "0". For all processing threads, while processing threads are executing no sub-processor programs, the processing threads read out periodically or nonperiodically the value of the sub-processor program register 1045 and then a processing thread that has read out the value which is not "0" as a result thereof will carry out a processing.

At the same time, said processing thread writes the value of "0" to the process-waiting sub-processor program register 1045. Based on the read-out value of the process-waiting sub-processor program register 1045, a processing thread carrying out a processing reads out a sub-processor program to be processed or the associated data and then executes it. At this time, the sub-processor program has already been read out by the sub-processor 1023 having said processing thread, and it is conceivable that the readout of the sub-processor program may not be required. In this manner, the sub-processing program can be promptly assigned to a processing thread which is currently not executing sub-processor programs and thus has available processing capacity. As a result, the information processing controller can be operated efficiently.

Now, a procedure for the use of the sub-processor program processing progress register 1046 is described. The sub-processor program processing progress register 1046 is a register of 2-bit (x, y) where the processing thread, to which the sub-processor program has been allotted, writes a processing progress status. For example, (0, 0) indicates a status of being unprocessed, (0, 1) being in processing (stage 1), (1, 0) being in processing (stage 2) and (1, 1) indicates that a processing has been completed. Together with additional 2 bits, the arrangement may be such that a processing thread to which a processing has been assigned is indicated by filling an processing thread identifier in the additional 2 bits. Alternatively, a register to insert a processing progress status of the sub-processor program may be provided for each of processing threads in the information processing controller 1011.

The sub-processor program processing progress register 1046 is accessible from the main processor 1021 in the information processing controller 1011, all of the sub-processors 1023 and all of the processing threads, so that the processing progress status of the sub-processor programs can be accurately grasped. If a processing-progress-status register is provided for each processing thread, the progress status can be grasped even while a plurality of sub-processor programs are simultaneously running. The above is an example of methods for managing the processing threads when each sub-processor 1023 has therein a plurality of virtually independent processing threads. It is assumed, in the following description, that if the sub-processor 1023 carries out some sort of processing, any of the processing threads in said sub-processor 1023 may carry out the processing and no difference will be caused in execution result due to the difference in processing thread. Hence, details on how a plurality of processing threads in the sub-processor 1023 would take partial charge of processings will not be mentioned here.

An operation of the receiving apparatus 100 structured as above will now be described. The RF unit 12 receives radio-frequency signals via the antenna 10. The RF unit 12 converts the radio-frequency signals into intermediate-frequency signals so that the bandwidth of the radio-frequency signals can be maintained. The A-D unit 14 converts the intermediate-frequency signals into digital signals. The processing unit 16 performs a processing on the channel for each of a plurality of channels contained in the digital signals. The processing unit 16 is comprised of a plurality of processors. Then, the processing unit 16 that performs the processing on the channels is comprised of a BPF 30, a quadrature detecting unit 32, an FFT unit 34, a demodulation unit 36, a decoding unit, an MPEG decompression unit 40 and the like, and each component is assigned to a predetermined processor. Such assignment will be done fixedly.

According to the present embodiments, the radio-frequency signals are directly converted to digital signals, the thus converted digital signals are separated channel by channel, and then the separated channels are processed respectively. Hence, the processings for a plurality of channels can be executed in parallel. The processing for each of the plurality of channels can be realized by a software program, so that the processing contents can be changed easily. The software programs corresponding to the processings for a plurality of channels are executed by a plurality of processors, so that the processing can be done at high speed. A plurality of processings contained in the software program are fixedly associated with a plurality of processors, so that the respective processors can store the corresponding processings in cache. Since they can be stored in cache, the processings can be carried out at high speed. The processings for a plurality of channels are executed in parallel. Thus, even if the channel is changed, a newly selected channel can be outputted with little delay.

The present invention has been described based on the embodiments which are only exemplary. It is therefore understood by those skilled in the art that other various modifications to the combination of each component and process described above are possible and that such modifications are also within the scope of the present invention.

In the above embodiments, the processing unit 16 selects by the program selector 42 one of a plurality of channels and outputs the selected channel. However, the present invention is not limited thereto and, for example, the processing unit 16 may output a plurality of channels in parallel. As an implementation example where a plurality of channels are outputted in parallel, it is conceivable that a plurality of pairs of monitors 20 and speakers 22 are provided then. That is, the respective programs outputted by the processing unit 16 are separately outputted to the respective monitors and speakers. In such a case, a plurality of pairs of video output units 44 and audio output units 46 need to be provided. According to this modification, even if there is provided a single RF unit 12, a plurality of programs can be simultaneously reproduced.

Figure 12:
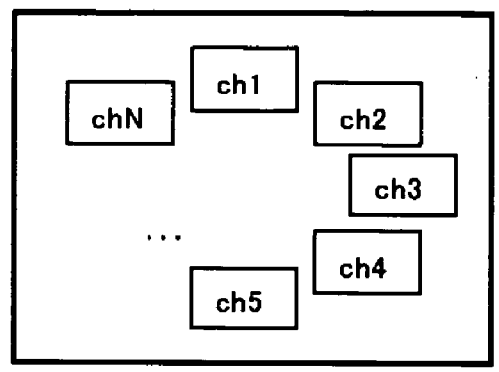
FIG. 12 shows another example of screen display on a monitor of FIG. 1 at the time of selecting a program.

Now, a description will be given of the screen display when arbitrary programs are selected by the operation unit 18 and the program selector 42. It is conceivable not only that a single program only is always outputted in full size but also that the thumbnail video pictures for a plurality of programs are multi-displayed as shown in FIG. 11 and FIG. 12, for example. "ch1", "ch2", . . . and "chN" in FIG. 11 and FIG. 12 is each a thumbnail vide picture for each channel. With this structure, a user can select visually a desired program at once. In order to realize this multi-display, it is required that the program selector 42 have a function to reduce the size of an image and a function to lay out a plurality of reduced images.

Figure 13:
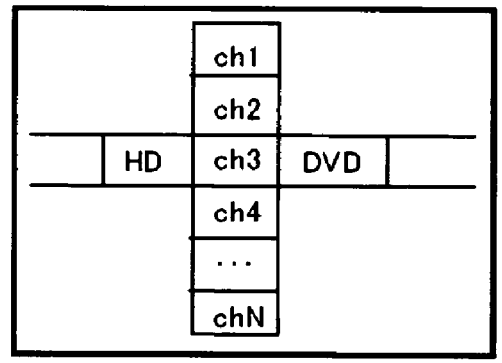
FIG. 13 shows still another example of screen display on a monitor of FIG. 1 at the time of selecting a program.

Furthermore, an arrangement as shown in FIG. 13 may be used as a screen display which can be easily operated by the user. In FIG. 13, a plurality of thumbnail video pictures are displayed in a cross shape. The media which are the source of the images, such as HD or DVD are shown in the horizontal axis whereas the thumbnail vide images for the images reproduced from the media are shown in the vertical axis. The user selects a thumbnail image using, for example, a cross key on the operation unit 18. In FIG. 13, the TV channel 3 is currently selected but pressing a left-right key on the cross key enables to select "HD (Hard Disk)" or "DVD" as the source medium. "HD" and "DVD" correspond respectively to the first external recording unit 1031-1 and the second external recording unit 1031-2. After selecting the medium, an arbitrary thumbnail video image is selected by pressing an up-down key on the cross key and determined by pressing on a decision key. In FIG. 13, channel 3 is selected but pressing the up-down key enables to select other channels. The thumbnail image selected and determined by the user is displayed in full size. In this manner, the desired image contents on various types of media can be accessed simply and instantaneously.

The processing unit 16 may record the signals, before being inputted to the MPEG decompression unit 40, in the first external recording unit 1031-1 and the second external recording unit 1031-2 in parallel. In FIG. 3, there are provided two external recording units 1031 but many more signals can be recorded in parallel, by further providing a third, a fourth external recording unit and so forth. If a plurality of signals can be recorded simultaneously on a single external recording unit, several times as large as the normal number of programs can be recorded simultaneously on the limited number of external recording units. According to this modification, a plurality of programs can be recorded simultaneously even if there is available a single RF unit 12. That is, it is only necessary that the software program processing is executed for a plurality of channels.

While the preferred embodiments of the present invention have been described using specific terms, such description including objectives and applications is for illustrative purposes only, and it is to be understood that other changes and variations may be made without departing from the spirit or scope of the appended claims.

What is claimed is:

1. A receiving apparatus, comprising:
    a receiver which receives a signal that includes a plurality of channels and is modulated;
    a processing unit that processes in parallel the plurality of channels contained in the signal received by said receiver;
    an image output unit that outputs image data for the channels processed in parallel by the processing unit,
    wherein said processing unit includes:
    a demodulation unit which demodulates the signal received by the receiver; and
    an MPEG decompression unit that carries out MPEG decoding in the plurality of channels contained in the signal demodulated by the demodulating unit and outputs the plurality of MPEG decoded channels in parallel,
    wherein the image output unit concurrently outputs thumbnail images of the image data for the plurality of channels output in parallel from the MPEG decompression unit.

2. The receiving apparatus according to claim 1, wherein the image output unit displays a plurality of thumbnail images in a cross shape such that the media that are the source of the images are shown in the horizontal axis and the thumbnail video images for the images reproduced from the media are shown in the vertical axis.

3. The receiving apparatus according to claim 2, further comprising a control that accepts from a user an instruction for selection and confirmation on a thumbnail image while the image output unit is displaying a plurality of thumbnail images in a cross shape,
    wherein the image output unit displays in full size the thumbnail image selected and confirmed by the user using the control.

4. A receiving method performed by a controller, comprising:
    receiving a signal that includes a plurality of channels and is modulated;
    processing by the controller in parallel the plurality of channels contained in the received signal;
    outputting image data for the channels processed in parallel,
    wherein said processing by the controller includes:
    demodulating the received signal; and
    carrying out MPEG decoding in the plurality of channels contained in the demodulated signal and outputting the plurality of MPEG decoded channels in parallel,
    wherein the image data outputting concurrently outputs thumbnail images of the image data for the plurality of channels output in parallel.

5. A computer program product embodied on a computer readable medium, comprising:
    a module that receives a signal that includes a plurality of channels and is modulated;
    a module that processes in parallel the plurality of channels contained in the received signal;
    a module that outputs image data for the channels processed in parallel,
    wherein the processing includes:
    demodulating the received signal; and
    carrying out MPEG decoding in the plurality of channels contained in the demodulated signal and outputting the plurality of MPEG decoded channels in parallel,
    wherein the image data outputting concurrently outputs thumbnail images of the image data for the plurality of channels output in parallel.

* * * * *